United States Patent [19]

Kikuta

[11] Patent Number: 4,983,534
[45] Date of Patent: Jan. 8, 1991

[54] SEMICONDUCTOR DEVICE AND METHOD OF MANUFACTURING THE SAME

[75] Inventor: Kuniko Kikuta, Tokyo, Japan
[73] Assignee: NEC Corporation, Tokyo, Japan
[21] Appl. No.: 555,678
[22] Filed: Jul. 20, 1990

Related U.S. Application Data

[63] Continuation of Ser. No. 7/293,417, Jan. 4, 1989, abandoned.

[30] Foreign Application Priority Data

Jan. 5, 1988 [JP] Japan ............................. 63-946
Jan. 13, 1988 [JP] Japan ........................... 63-3850

[51] Int. Cl.$^5$ ............................................. H01L 21/331
[52] U.S. Cl. .................................... 437/31; 437/22; 437/126; 437/909; 148/DIG. 10; 148/DIG. 11; 148/DIG. 72; 148/DIG. 84; 357/16; 357/34
[58] Field of Search ................ 437/31, 32, 33, 909, 437/917, 126, 128; 148/DIG. 10, DIG. 11, DIG. 72, DIG. 84; 357/16, 34

[56] References Cited

U.S. PATENT DOCUMENTS 2,569,347  9/1951  Shockley .
4,062,034 12/1977  Matsushita et al. ............. 437/126
4,178,190 12/1979  Polinsky .
4,302,763 11/1981  Ohuchi et al. .
4,559,696 12/1985  Anand et al. .................... 437/31
4,768,074  8/1988  Yoshinda et al. ................ 357/34
4,769,337  9/1988  Maeda ............................ 437/46

FOREIGN PATENT DOCUMENTS 0005275  1/1977  Japan ............................... 357/34

OTHER PUBLICATIONS

"Heterostructure Bipolar Transistors and Integrated Circuits", Kroemer Proceedings of the IEEE, Volume 70, No. 1, Pages 13-25, January 1982.
"An EPR Study On High Energy Ion Implanted Silicon", Lee et al, Ion Implantation In Semiconductors, Plenum Press, cover page and pp 519-520, 522-524.
"P-Type Doping Observed in Silicon Implanted With High Energy Carbon Ions", Stephen et al, Ion Implantation In Semiconductors, Plenum Press, cover page and pages 619-625 (1975).

Primary Examiner—Brian E. Hearn
Assistant Examiner—Tuan Nguyen
Attorney, Agent, or Firm—Burns, Doane, Swecker & Mathis

[57] ABSTRACT

A method of manufacturing a semiconductor device includes forming a base region and a collector region on an Si substrate, forming, on the base region, an emitter region of a semiconductor material having an energy gap larger than that of Si, forming an Si film on the emitter region, ion-implanting an element into a surface portion of the emitter region or at the interface of the emitter region and the Si film and a periphery portion of the interface, and simultaneously forming electrodes on the base and collector regions and on the Si film. A heterojunction bipolar transistor manufactured by the above method is also disclosed.

16 Claims, 3 Drawing Sheets

SEMICONDUCTOR DEVICE AND METHOD OF MANUFACTURING THE SAME

This application is a continuation of application Ser. No. 07/293,417, filed Jan. 4, 1989 now abandoned.

BACKGROUND OF THE INVENTION

The present invention relates to a semiconductor device and a method of manufacturing the same and, more particularly, to a semiconductor device a part of which is formed on a substrate of a first semiconductor by using a second semiconductor material having an energy gap larger than that of the first semiconductor, and a method of manufacturing the same.

A conventional semiconductor device a part of which is formed on a substrate of a first semiconductor by using a second semiconductor material having an energy gap larger than that of the first semiconductor and a method of manufacturing the same have the following drawbacks.

(1) Since the conventional semiconductor device has a structure wherein a second semiconductor is exposed on a surface of the device, wiring operations and the like must be performed for the first and second semiconductors, respectively. For example, in a silicon heterojunction bipolar transistor in which a base and a collector are formed on a silicon substrate, and an emitter of a compound semiconductor having an energy gap larger than that of silicon is formed thereon, since the material of the emitter is different from that of the base and collector, a wiring material and a wiring method suitable for each element must be applied. Therefore, the manufacturing steps such as wiring are complicated.

(2) Since the second semiconductor is exposed on the surface during manufacturing, impurity contamination is undesirably caused by the second semiconductor such as a material for the emitter, and hence a first semiconductor (e.g., silicon) process line cannot be used after the second semiconductor is formed.

(3) Since an electron barrier is formed on the interface between the first and second semiconductors, a contact resistance is increased and the characteristics of the device are undesirably degraded. In order to eliminate the above drawbacks, for example, in the silicon heterojunction bipolar transistor, in order to form an ohmic contact with an emitter formed using a material such as a compound semiconductor having a large energy gap, an impurity is heavily doped in a contact portion with an emitter electrode material by ion implantation, or a wiring material for the emitter must be varied from that for the base and collector.

According to the above method, however, since the activation ratio of the impurity doped in the emitter material having a large energy gap is limited, a contact resistance is not sufficiently decreased.

SUMMARY OF THE INVENTION

It is an object of the present invention to provide a semiconductor device and a method of manufacturing the same, wherein the above drawbacks of the prior art can be eliminated, simple processes can be used without selecting different wiring materials and different wiring steps for first and second semiconductors, impurity contamination caused by the second semiconductor can be prevented, and a contact resistance of an ohmic contact can be sufficiently small.

A method of manufacturing the semiconductor device according to the present invention comprises the steps of: forming a first part of the semiconductor device of a first semiconductor material on a substrate of the first semiconductor material; forming, on the first part, a second part of the semiconductor device of a second semiconductor material having an energy gap larger than that of the first semiconductor material; forming a film of the first semiconductor material on the second part; ion-implanting an element into the surface portion of the second part or at the interface of the second part and the film and the periphery portion of the interface; and forming electrodes for the first and second parts.

A heterojunction bipolar transistor according to the present invention comprises a collector and a base of a first semiconductor material which are formed on a substrate of the first semiconductor material, an emitter of an n- or p-type second semiconductor material having an energy gap larger than that of the first semiconductor material and formed on the base, and a film of the first semiconductor material formed on the emitter and having the same conductivity type as that of the emitter.

The first semiconductor film consisting of the same material as that of the substrate is formed on the second semiconductor having a large band gap, so that the second semiconductor is not exposed on the surface during manufacturing and impurity contamination caused by the second semiconductor can be prevented. Therefore, a wiring material for the first semiconductor can be the same as that for the second semiconductor and hence the number of manufacturing steps such as wiring step can be reduced.

Since the band gap of the first semiconductor film is smaller than that of the second semiconductor, an ohmic contact is easily formed, thus reducing a contact resistance.

An element to be ion-implanted into the interface of the first semiconductor film and the second semiconductor is selected as an element which forms a compound with an element constituting the second semiconductor, the compound having a band gap smaller than that of the second semiconductor, so that the band gap at the interface is continuously decreased, thus easily forming an ohmic contact. Furthermore, by ion implantation, an electron barrier caused by an oxide film or the like at the interface is subjected to mixing, so that the contact resistance can be reduced.

In addition, an element to be ion-implanted into the interface of the first semiconductor film and the second semiconductor is selected as an impurity element which has the same conductivity type as that of the second semiconductor, so that electrons easily tunnel through the barrier at the interface, thus reducing a contact resistance.

DETAILED DESCRIPTION OF THE PREFERRED EMBODIMENTS

Embodiments of the present invention will be described below with reference to the accompanying drawings.

FIGS. 1(A) to 1(D) are sectional views showing a method of manufacturing a silicon heterojunction bipolar transistor according to an embodiment of the present invention.

Figure 1A:
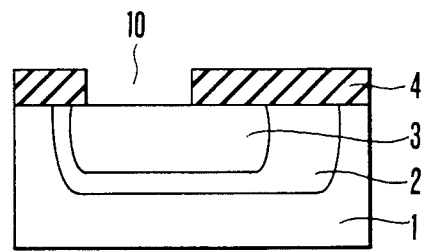
FIGS. 1(A) to 1(D) are sectional views showing an embodiment of the present invention.
Figure 1B:
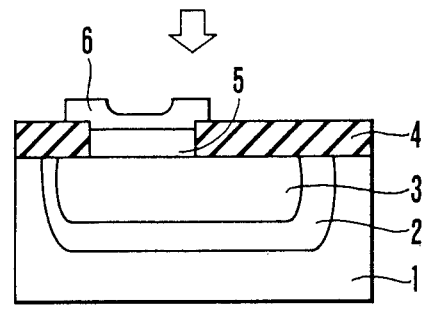
Figure 1C:
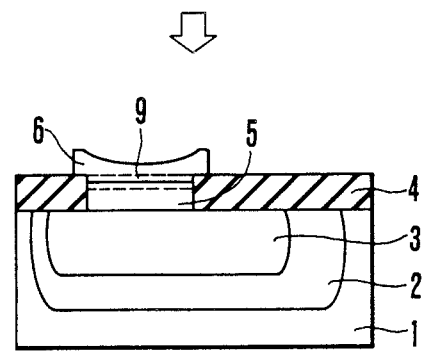

In FIG. 1(A), phosphorus ions are implanted in a p-type silicon substrate 1 having a resistivity of 10 Ω·cm at a dose of $1\times10^{12}/cm^2$ and an acceleration voltage of 150 keV. Thermal diffusion is performed in a nitrogen atmosphere at 1,100° C. for 30 hours, thus forming an n-type collector 2. Then, boron ions are implanted in the n-type collector 2 at a dose of $1\times10^{14}/cm^2$ and an acceleration voltage of 30 keV. The annealing is performed at 950° C. for 20 minutes, thereby forming a p-type base 3. A 5,000 -Å thick silicon oxide film 4 having an opening for forming an emitter is deposited on the silicon substrate 1 on which the collector 2 and the base 3 are formed, thus forming an emitter region 10. In FIG. 1(B), a 3,000 -Å thick film of n-type gallium phosphide (GaP) having an energy gap larger than that of silicon is selectively grown in the emitter region 10 on the silicon substrate 1 by epitaxial growth using trichlorogallium and phosphine at 450° C., thus forming an emitter 5. Then, a 500 -Å thick polysilicon film 6 is deposited on the emitter 5 so as to cover the emitter 5. In FIG. 1(C), arsenic ions are implanted at a concentration of $5\times10^{15}/cm^3$ and an acceleration voltage of 80 keV so that the concentration peak of the arsenic ions appears on the interface between GaP of the emitter 5 and the silicon film 6, thus forming an ion-implanted layer 9. Rapid thermal annealing is performed in a nitrogen atmosphere at 850° C. for 5 seconds. In the emitter 5 side, arsenic ions are replaced with phosphorus ions and a GaPAs crystal is obtained, thus decreasing an energy gap. In the silicon 6 side, arsenic ions serve as an n-type dopant and an ohmic contact is easily formed.

Figure 1D:
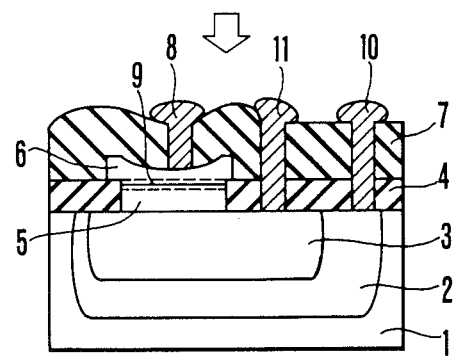

Thereafter, as shown in FIG. 1(D), a wiring layer 8 for the emitter 5 is formed through an oxide film 4 and an oxide film 7 formed thereon, together with formation of wiring layers 10 and 11 corresponding to the collector 2 and the base 3.

As described above, according to a method of manufacturing the semiconductor device of the present embodiment, the polysilicon film 6 is formed on the emitter 5 of GaP, so that the GaP emitter 5 is not exposed on the surface during manufacturing and impurity contamination caused by the GaP emitter 5 can be prevented. Therefore, a process line for Si devices can be used. In addition, since the GaP emitter 5 is covered by the polysilicon film 6, separate wiring steps are not required, and the manufacturing steps can be reduced.

Figure 2:
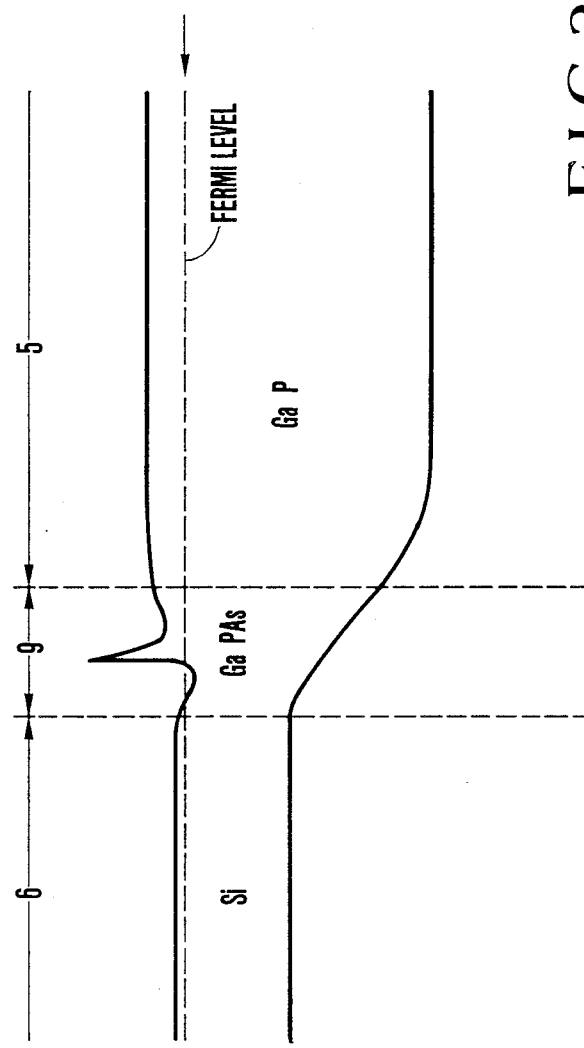
FIG. 2 is a view showing characteristics of a semiconductor device shown in FIG. 1.

FIG. 2 is a chart showing band diagram in a contact portion between the emitter 5 and the polysilicon film 6 of the transistor shown in FIG. 1. Arsenic ions are implanted in the emitter 5 of GaP having a large energy gap and annealing is performed, so that some of phosphorus ions are substituted by arsenic ions and GaPAs is produced. Therefore, the energy gap on the interface is continuously decreased. Arsenic ions are also heavily implanted in polysilicon film 6, and the aluminum wiring layer 8 side of the silicon film 6 consists of aluminum silicide, thus achieving a good ohmic contact.

In addition, an electron barrier caused by an oxide film or the like on the interface is subjected to mixing, so that the contact resistance can be reduced.

Therefore, according to the present embodiment, an ohmic contact is easily formed as compared with direct deposition of a metal on gallium phosphide having a large gap.

Figure 3A:
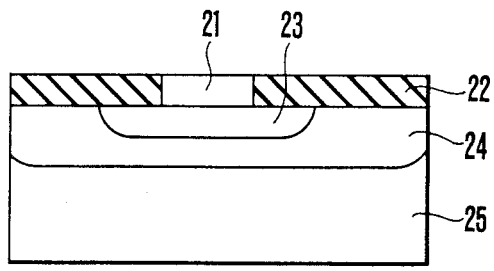
FIGS. 3(A) to 3(C) are sectional views showing another embodiment of the present invention.
Figure 3B:
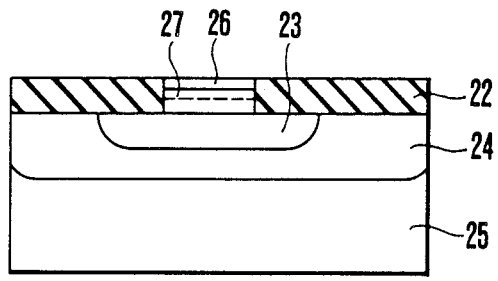
Figure 3C:
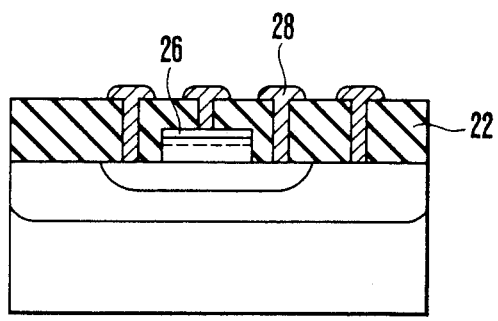

FIGS. 3(A) to 3(C) are sectional views showing another embodiment of manufacturing steps of a heterojunction bipolar transistor according to the present invention.

In FIG. 3(A), phosphorus and boron ions are implanted in a p-type silicon substrate 25 having a resistivity of 10 Ω·cm, at a dose of $1\times10^{12}/cm^2$ and an acceleration voltage of 150 keV, and at a dose of $1\times10^{14}/cm^2$ and an acceleration voltage of 30 keV, respectively. Then, annealing is performed and an n-type collector 24 and a p-type base 23 are formed. Thereafter, an n-type gallium phosphide film serving as an emitter material having a large energy gap is deposited by epitaxial growth so that an emitter 21 is formed. In FIG. 3(B), silicon ions are implanted in the surface of the emitter 21 at a dose of $1\times10^{14}/cm^2$ so that electrons can tunnel through the electron barrier between gallium phosphide and silicon ions. Then, rapid thermal annealing is performed in a nitrogen atmosphere at 900° C. for 5 seconds, thus forming an ion-implanted layer 27. Then, a natural oxide film on the surface is etched by a hydrogen fluoride aqueous solution and a hydrogen chloride aqueous solution, and thereafter, a 500 -Å thick silicon epitaxial film 26 obtained by doping antimony ions at a concentration of $1\times10^{19}/cm^3$ and 750° C. is formed by silicon molecular beam epitaxy. Thereafter, in FIG. 3(C), contact holes and wiring layers 28 for the base 23, the collector 24, and the emitter 21 are simultaneously formed.

What is claimed is:

1. A method of manufacturing a semiconductor device, comprising the steps of:
    forming a first part of said semiconductor device on a Si substrate, said first part being made of Si;
    forming, on said first part, a second part of said semiconductor device of a semiconductor material having an energy gap larger than that of Si;
    covering said second part with a Si film;
    ion-implanting an element at the interface of said second part and said Si film and a periphery portion of said interface, said element forming a compound with said semiconductor material, said compound having an energy gap smaller than that of said semiconductor material; and
    forming electrodes on said first part and on said Si film, respectively.

2. A method of manufacturing a semiconductor device as claimed in claim 1, wherein said semiconductor material is GaP.

3. A method of manufacturing a semiconductor device as claimed in claim 2, wherein said implanted element is As.

4. A method of manufacturing a semiconductor device as claimed in claim 1, wherein said implanted element is As.

5. A method of manufacturing a semiconductor device as claimed in claim 1, wherein said implanted element is an element of the same conductivity type as the second part.

6. A method of manufacturing a semiconductor device, comprising the steps of:

forming a first part of said semiconductor device on a Si substrate, said first part being made of Si;

forming, on said first part, a second part of said semiconductor device of a semiconductor material having an energy gap larger than that of Si;

covering said second part with a Si film;

ion-implanting an element formed of Si at the interface of said second part and said Si film and a periphery portion of said interface; and forming electrodes on said first part and on said Si film, respectively.

7. A method of manufacturing a heterojunction bipolar transistor, comprising the steps of:

forming a collector region and a base region on a Si substrate, said base region being made of Si;

forming on said base region an emitter region of GaP;

forming an Si film of said one conductivity type on said emitter region;

forming wiring layers for said emitter region, said base region, and said collector region, the wiring layer for said emitter region being arranged on said Si film;

implanting ions of As at the interface of said emitter region and said Si film and the periphery portion of said interface.

8. A method of manufacturing a heterojunction bipolar transistor, comprising the steps of:

forming a collector region and a base region on a Si substrate, said base region being made of Si;

forming on said base region an emitter region of GaP;

forming an Si film of said one conductivity type on said emitter region;

forming wiring layers for said emitter region, said base region, and said collector region, the wiring layer for said emitter region being arranged on said Si film;

implanting ions of Si at the interface of said emitter region and said Si film and the periphery portion of said interface.

9. A method of manufacturing a semiconductor device, comprising the steps of:

forming a first part of said semiconductor device on a Si substrate, said first part being made of Si;

forming, on said first part, a second part of said semiconductor device of a semiconductor material having an energy gap larger than that of Si;

covering said second part with a Si film;

ion-implanting an element into a surface portion of said second part, said element forming a compound with said semiconductor material, said compound having an energy gap smaller than that of said semiconductor material; and forming electrodes on said first part and on said Si film, respectively.

10. A method of manufacturing a semiconductor device as claimed in claim 9, wherein said semiconductor material is GaP.

11. A method of manufacturing a semiconductor device as claimed in claim 10, wherein said implanted element is As.

12. A method of manufacturing a semiconductor device as claimed in claim 9, wherein said implanted element is As.

13. A method of manufacturing a semiconductor device as claimed in claim 9, wherein said implanted element is an element of the same conductivity type as the second part.

14. A method of manufacturing a semiconductor device, comprising the steps of:

forming a first part of said semiconductor device on a Si substrate, said first part being made of Si;

forming, on said first part, a second part of said semiconductor device of a semiconductor material having an energy gap larger than that of Si;

covering said second part with a Si film;

ion-implanting an element formed of Si into a surface portion of said second part; and forming electrodes on said first part and on said Si film, respectively.

15. A method of manufacturing a heterojunction bipolar transistor, comprising the steps of:

forming a collector region and a base region on a Si substrate, said base region being made of Si;

forming on said base region an emitter region of GaP;

forming an Si film of said one conductivity type on said emitter region;

forming wiring layers for said emitter region, said base region, and said collector region, the wiring layer for said emitter region being arranged on said Si film;

implanting ions of As into a surface of said emitter region.

16. A method of manufacturing a heterojunction bipolar transistor, comprising the steps of:

forming a collector region and a base region on a Si substrate, said base region being made of Si;

forming on said base region an emitter region of GaP;

forming an Si film of said one conductivity type on said emitter region;

forming wiring layers for said emitter region, said base region, and said collector region, the wiring layer for said emitter region being arranged on said Si film;

implanting ions of Si into a surface of said emitter region.

* * * * *